US009402301B2

United States Patent
Paine et al.

(10) Patent No.: US 9,402,301 B2
(45) Date of Patent: Jul. 26, 2016

(54) VERTICAL RADIO FREQUENCY MODULE

(71) Applicant: Raytheon Company, Waltham, MA (US)

(72) Inventors: Waid Paine, McKinney, TX (US); James S. Wilson, Hurst, TX (US); Cary C. Kyhl, Grapevine, TX (US); Robert S. Isom, Allen, TX (US)

(73) Assignee: Raytheon Company, Waltham, MA (US)

( * ) Notice: Subject to any disclaimer, the term of this patent is extended or adjusted under 35 U.S.C. 154(b) by 72 days.

(21) Appl. No.: 14/565,744

(22) Filed: Dec. 10, 2014

(65) Prior Publication Data

US 2016/0174357 A1    Jun. 16, 2016

(51) Int. Cl.
*H05K 7/20* (2006.01)
*H05K 1/02* (2006.01)
*H05K 1/11* (2006.01)
*H05K 1/18* (2006.01)
*H01R 12/72* (2011.01)

(52) U.S. Cl.
CPC .............. *H05K 1/0204* (2013.01); *H01R 12/72* (2013.01); *H05K 1/0237* (2013.01); *H05K 1/111* (2013.01); *H05K 1/183* (2013.01); *H05K 2201/06* (2013.01); *H05K 2201/09036* (2013.01); *H05K 2201/10098* (2013.01)

(58) Field of Classification Search
CPC ........ H05K 7/20; H05K 7/2039; H01Q 21/00
USPC .......... 361/711, 807, 809, 760; 343/853, 700, 343/754
See application file for complete search history.

(56) References Cited

U.S. PATENT DOCUMENTS

| | | | |
|---|---|---|---|
| 5,099,254 A * | 3/1992 | Tsukii ............... | H01Q 21/0025 333/247 |
| 6,005,531 A | 12/1999 | Cassen et al. | |
| 6,034,633 A | 3/2000 | Cassen et al. | |
| 6,278,400 B1 * | 8/2001 | Cassen ..................... | G01S 7/03 342/175 |
| 2006/0255440 A1 * | 11/2006 | Miyazaki .......... | H01L 23/49822 257/679 |

OTHER PUBLICATIONS

PCT International Search Report of the ISA for PCT No. PCT/US2015/054400 dated Jan. 27, 2016; 5 pages.
PCT Written Opinion of the ISA for PCT No. PCT/US2015/054400 dated Jan. 27, 2016; 6 pages.

* cited by examiner

*Primary Examiner* — Dion R Ferguson
*Assistant Examiner* — Mandeep S Buttar
(74) *Attorney, Agent, or Firm* — Daly, Crowley, Mofford & Durkee, LLP

(57) ABSTRACT

A radio frequency (RF) module having a plurality of channels includes a heat sink having at least one tapered edge; a substrate disposed over a surface of the heat sink such that the tapered edge of the heat sink extends past a boundary of the substrate. RF, logic and power circuitry is disposed on the substrate and one or more RF signal ports are formed on an edge of the substrate to allow the RF module to be used in an array antenna having a brick architecture. The tapered edge heat sink provides both a ground plane for RF signal components and a thermal path for heat generating circuits disposed in the substrate.

15 Claims, 5 Drawing Sheets

VERTICAL RADIO FREQUENCY MODULE

BACKGROUND

As is known in the art, high density/power packaging of radio frequency (RF) modules in RF systems which include actively electronic scanned array (AESA) antenna systems presents challenges for thermal management and component spacing. The spacing of components in an AESA antenna is generally driven by the spacing of the array antenna elements (i.e. the physical distance between individual antenna elements which make up the array). The antenna element spacing is a function of the AESA operating frequency. Thus, the spacing of antenna elements generally becomes smaller with increasing RF operating frequency.

Often, in AESA antennas operating at relatively high RF frequencies, the available area (or footprint) in which to mount RF modules containing RF components (e.g. T/R circuits), is generally too small to accommodate a so-called panel architecture (i.e. an antenna architecture in which RF and other circuit components are disposed in a plane which is parallel or horizontal to the AESA antenna aperture).

One array architecture and associated construction technique for increasing the circuit density in an AESA antenna is to fabricate the AESA antenna system using a so-called "brick" architecture (also referred to as a vertical architecture). In a brick architecture, RF signals, logic signals and power signals coupled to the AESA antenna are generally distributed in a plane that is substantially orthogonal to a plane coincident with (or defined by) the antenna aperture. Thus, RF modules which house RF, logic and power circuits utilized in an AESA antenna system, for example, are said to be vertically oriented with respect to (or orthogonal to) the antenna aperture. This means that an edge of the RF module is mounted in a direction facing the AESA aperture.

Since in a vertical architecture an edge of the RF module is mounted in a direction facing the AESA aperture, the amount of surface area on the RF module typically available to conductively remove waste heat from the RF module is limited. Furthermore, a portion of this same edge is also required for electrical connections between the RF module and the AESA antenna. This further limits the amount of surface area on the edge of RF module available to remove heat from the module. Thus, in a brick or vertical array architecture, a relatively small amount of area on the edge of the RF module is available to help thermally conduct heat away from the RF module itself. Accordingly, a vertical (or brick) architecture, creates difficulties with providing connectors on the RF module and also with thermal management of the RF module.

SUMMARY

In accordance with one aspect of the concepts, systems and techniques described herein, a radio frequency (RF) module includes a substrate on which heat generating components are disposed and a heat sink coupled to the substrate with a portion of the heat sink extending past an edge of the substrate RF, logic and DC circuitry is disposed on the substrate. Signal paths for at least RF signals extend to one edge of the substrate. The edge of the substrate is plated with an electrically conductive material to form signal pads disposed the RF signal paths on the edge of the substrate. The heat sink acts as both a thermal conductor and a ground plane for the heat generating circuitry disposed on the substrate. A multifunction connector is also disposed on an edge of the substrate to provide input and output signal paths for DC and logic signals.

With this particular arrangement, an RF module for use in an array antenna is provided. By forming RF signal pads on an edge of the RF module, an RF module having a reduced connector size for RF signals is provided. This allows a plurality of such RF modules to be closely spaced in an array antenna which in turn allows the array antenna to be provided having closely spaced antenna elements which comprise the array antenna. Thus, a plurality of such vertical RF modules and/or subassemblies of such modules may be coupled for use in an active electronic scanned array (AESA) antenna, for example.

Furthermore, by extending the RF module heat sink structure past an edge of a substrate on which heat generating components (e.g. so-called "active circuit components" or more simply "active circuits") are disposed, a thermal path is provided through which heat may be directed away from the RF module. The extended portion of the heat sink may be embedded in a cold plate or other heat sinking structure (external to the RF module) to further improve removal of heat from the RF module.

Moreover, by providing an RF module having an extended heat sinking structure, the RF module may be configured for vertical alignment with respect to an array antenna. By vertically orienting the RF module in an array antenna (e.g. an AESA antenna) a circuit and technique to reduce, and ideally minimize, the length of an RF signal path (i.e. an RF interconnect) between RF circuit components in the RF module and signal ports of a phased array antenna is provided. By reducing, and ideally minimizing RF signal and all ground path lengths, insertion loss characteristics between input/output signal ports of an RF module and input/output signal ports of an antenna are likewise reduced and ideally minimized. Channel to channel coupling is also reduced and isolation improved. Such a reduction in circuit insertion loss characteristics and/or an increase in channel to channel isolation characteristics improves performance characteristics of systems employing an AESA antenna having a brick architecture.

In accordance with a further aspect of the concepts, systems and techniques described herein, an RF system includes an antenna assembly having a radiating surface and a signal port surface, a heat sink disposed over the signal port surface of the antenna assembly and a plurality of RF modules, each of the RF modules having an RF module heat sink having at least one tapered edge embedded in a surface of the heat sink which is disposed over the signal port surface of the antenna assembly. The RF module further includes a substrate disposed over the RF module heat sink with the substrate having a width such that the tapered portion of the heat sinking structure extends past an edge of the substrate. RF, logic and DC circuitry is disposed on the substrate. The RF module heat sink acts as both a thermal conductor and a ground plane for heat generating circuitry disposed on the substrate. Signal paths for at least RF signals extend to one edge of the substrate. The edge of the substrate is plated with an electrically conductive material to form RF signal pads about the RF signal paths on the edge of the substrate. A ground plane is disposed on an edge of the substrate and electrically isolated from the RF signal pads. A multifunction connector is also disposed on an edge of the substrate to provide input and output signal paths for DC and logic signals.

With this particular arrangement, an RF system having a relatively high density/power characteristic is provided. By utilizing an RF module having an extended heat sink structure, the RF module can be thermally coupled to a larger, external heat sink without requiring additional space. This helps satisfy thermal management requirements and component spacing needs of RF systems. In one embodiment the RF system is provided as a radar system comprising an AESA antenna assembly.

One of the barriers in the continuing drive to reduce RF package size is the associated RF connectors. The concepts, circuits and techniques described herein result in an RF module having a reduced RF connector size in combination with a technique unique to remove waste heat by creating a lamination allowing for electrical traces to be placed on various layers within a substrate. The resulting assembly significantly reduces the amount of area required for RF signal connections while reducing, and ideally minimizing, a distance between the RF component heat sources and a secondary heat sink structure such as a cold plate.

Providing an RF module having a thermally and electrically conductive heat sink which can extend into a separate heat sink structure such as a cold plate, for example, increases the area available for conductive waste heat removal, while reducing (and ideally minimizing) the spacing between RF modules.

If the RF module assembly is fabricated by the lamination of High Temperature Co-fired Ceramic (HTCC), this allows for electrical traces to be placed on various layers within the substrate. The process allows for an RF signal line to be embedded (or "buried") within the substrate and the required grounding (necessary for the creation of a transmission lines) to be placed at desirable locations. RF signal traces are routed to the outer edge of the RF module and pads can be formed on an edge of the substrate by selectively plating the edge of the RF module substrate.

The selective plating allows for non-conductive regions which separate the ground plane from the signal pads thus creating a port for the RF transmission line. In this design the plating which creates the RF ground plane is also in electrical contact with the metallic heat sink which now becomes part of the RF ground plane. The continuation of this RF ground allows for the use of a small diameter connector pin to pass though a cold plate making connection with an antenna assembly while maintaining RF signal integrity. The resulting assembly significantly reduces the area required for RF signal connections while reducing (and ideally minimizing) the distance between the RF component heat sources and the cold plate.

BRIEF DESCRIPTION OF THE DRAWINGS

The foregoing features may be more fully understood from the following description of the drawings in which.

DETAILED DESCRIPTION

Figure 1:
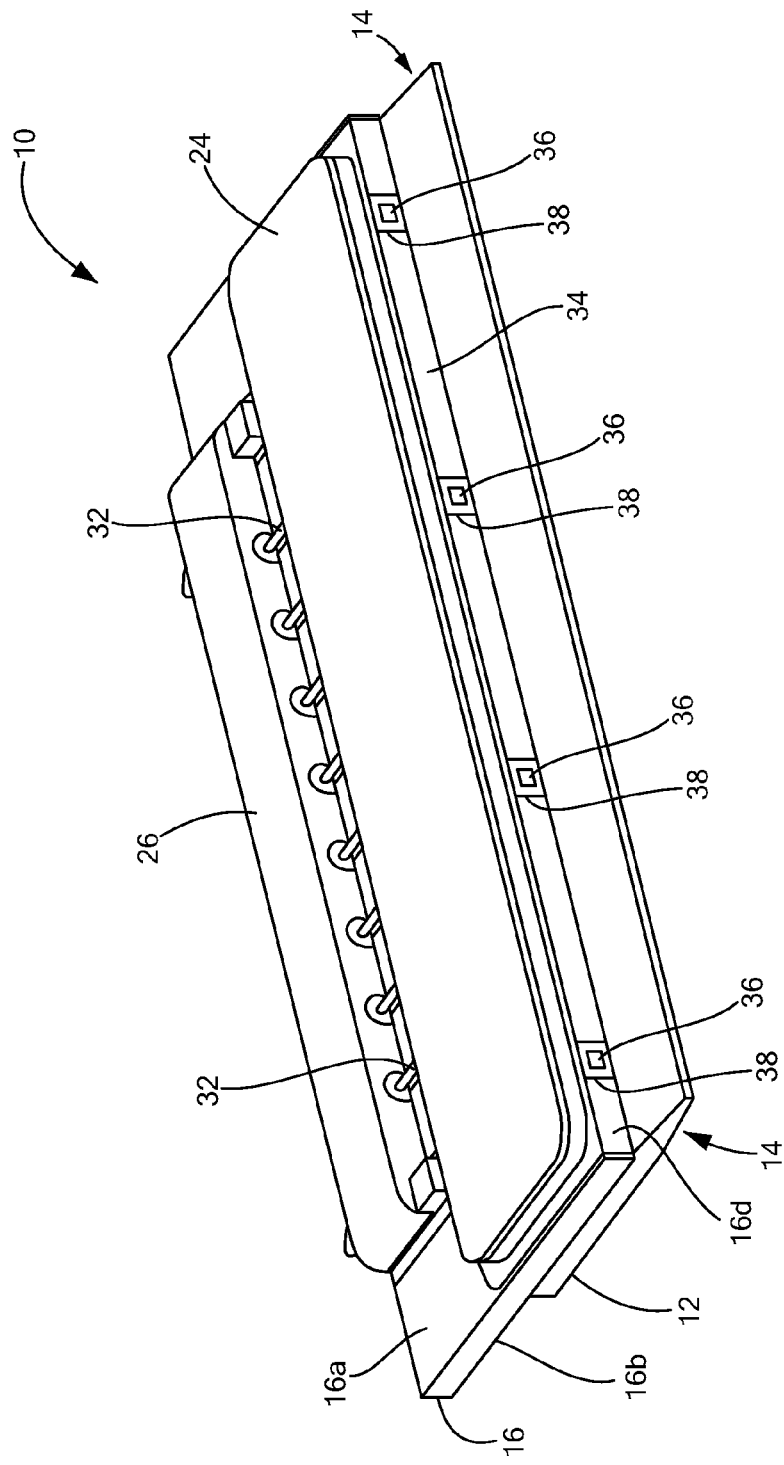
FIG. 1 is an isometric view of a multi-channel, vertical radio frequency (RF) module.
Figure 1A:
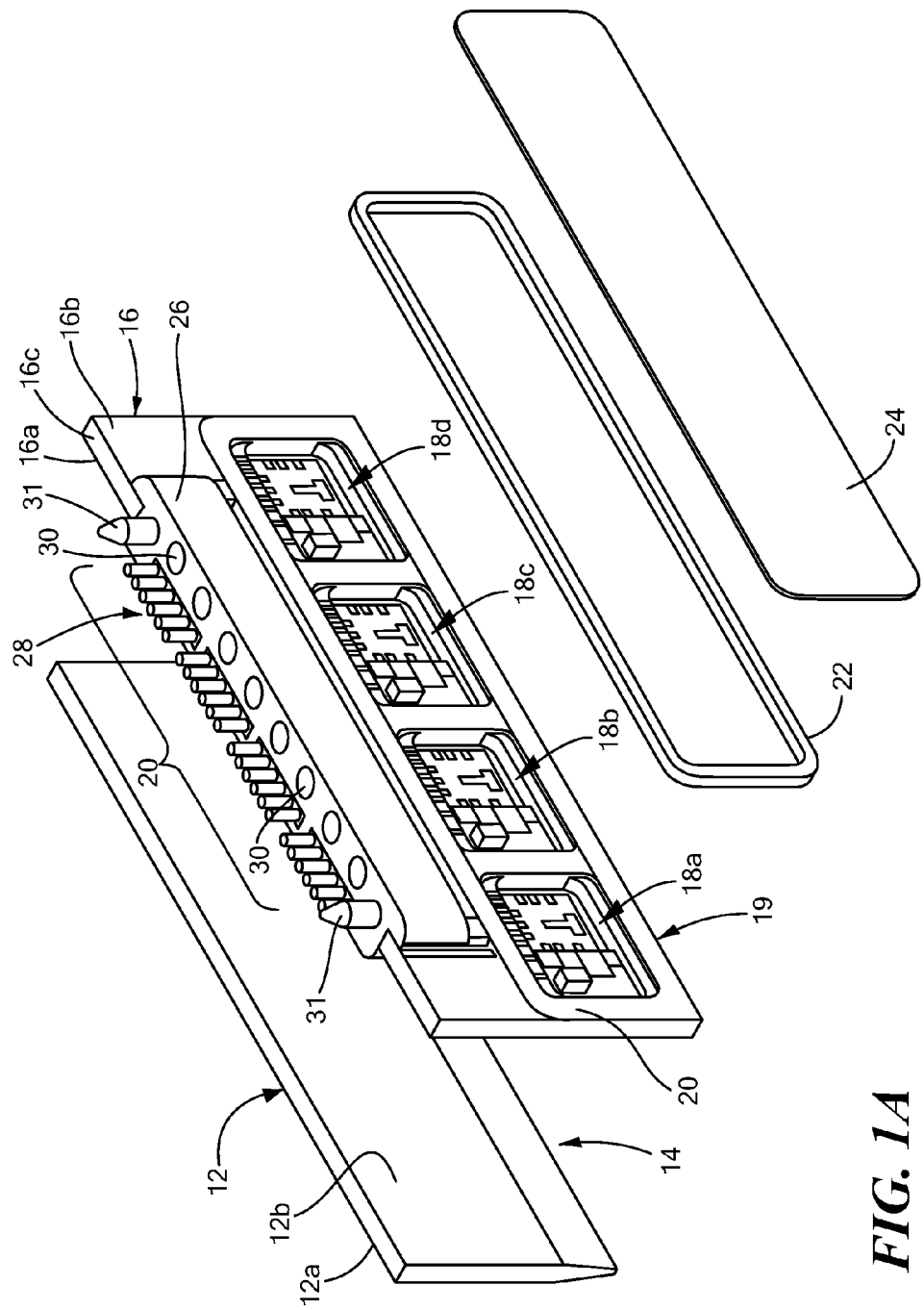
FIG. 1A is an exploded isometric view of the vertical RF module of FIG. 1.

Referring now to FIGS. 1 and 1A, in which like elements are provided having like reference designations, an illustrative RF module 10 having a plurality of channels, here four channels (not visible in FIGS. 1 and 1A), includes a heat sink 12 having first and second opposing surfaces 12a, 12b. A substrate 16 having first and second opposing surfaces 16a, 16b, is disposed over surface 12b of heat sink 12. Surface 12a of heat sink 12 is electrically and thermally conductive so as to function as a ground plane as well as a thermal path for electrical and heat generating circuitry disposed thereon.

For reasons which will become apparent from the description provided hereinbelow, heat sink 12 acts as both an electrical and thermal conductor for circuitry disposed thereon and at least a portion 14 of the heat sink extends past an edge of substrate 16 is tapered. It should be appreciated that heat sink 12 may be provided as any type of heat sinking structure and may be provided, for example, from any material which is both electrically and thermally conductive. Alternatively, heat sink 12 may be provided from a material which is non-conductive (e.g. neither electrically nor thermally conductive) and a thermally and electrically conductive material may be disposed thereover (e.g. via an additive or subtractive process) such that at least portions of the surface of heat sink 12 serve as both electrical and thermal conductors.

In one embodiment, substrate 16 is provided as a so-called mixed signal multilayer substrate meaning that the substrate includes circuits and signal paths for a variety of different types of signals such as RF, logic and power signals. Substrate 16 may be provided, for example, by the lamination of high temperature co-fired ceramic (HTCC) materials. A conductive paste is disposed on HTCC and HTCC-based materials to form signal paths (e.g. RF transmission lines), ground planes and other circuitry.

Since such conductive pastes are relatively lossy at RF frequencies (e.g. lossy compared to losses in RF signals propagating through pure copper transmission lines used in polytetrafluoroethene (PTFE) based boards, for example), reducing the length of signal paths on the substrate is desirable since it improves insertion loss and other characteristics of RF circuits provided on substrate 16. Furthermore, HTCC materials tend to have a dielectric constant which is higher than the dielectric constant of PTFE based boards (for example) and this also makes it desirable to use efficient (e.g. straight and short) transmission lines in a multiplayer substrate provided from HTCC.

In alternate embodiments, substrate 16 may be provided by the lamination of low temperature co-fired ceramic (LTCC) based materials. LTCC materials also use a conductive paste to form signal paths (e.g. RF transmission lines) and ground planes and tend to have a dielectric constant which is higher than the dielectric constant of PTFE based boards, for example and this is not suitable for both RF transmission lines and efficient RF radiators. Thus, for at least the reasons stated above, it desirable to use efficient (e.g. straight and short) transmission lines in a multiplayer HTCC substrate.

In still other alternate embodiments, substrate 16 may be provided from polytetrafluoroethene (PTFE) based materials since such materials have favorable RF characteristics (e.g. favorable insertion loss characteristics) compared with ceramic materials such as HTCC and LTCC materials.

Regardless of the particular material from which substrate 16 is provided, circuitry is disposed on the substrate. In preferred embodiments, substrate 16 is provided as a multiplayer substrate having one or more or RF, digital and power circuitry disposed thereon and having one or more or RF, digital and power signals propagating therein.

In the illustrative embodiment of FIGS. 1 and 1A, RF module 10 includes a plurality of circuits, here four circuits 18a, 18b, 18c, 18d for a corresponding number of transmit/receive (T/R) channels, here four T/R channels. Circuits 18a-18d may comprise integrated circuits (e.g. monolithic microwave integrated circuits (MMICs) or as so-called chip-and-bond integrated circuits). The particular type of circuit used is selected to satisfy the needs of a particular application. Those of ordinary skill in the art will appreciate, of course, that RF module 10 may include any number of circuits or T/R channels required to satisfy the needs of a particular application. In some applications, circuits 18a-18d may be provided as part of only a receive channel or only a transmit channel.

The circuitry 18a-18d includes at least RF circuits and/or devices and may also include digital circuitry and power circuitry. As illustrated in FIG. 1A, circuits 18a, 18b, 18c, 18d are each disposed in a respective ones of recess regions 19a-19d provided in substrate 16 such that the circuits 18a, 18b, 18c, 18d do not extend above a plane defined by surface 16b of substrate 16.

When substrate 16 and circuits 18a-18d are disposed over a surface of heat sink 12, heat sink 12 acts as both an electrical and thermal conductor for the circuitry disposed thereon. In some embodiments, the surface of the substrate 16 disposed against a surface of the heat sink 12 (here substrate surface 16a) may be provided having an electrically and thermally conductive material disposed thereover (e.g. an electrical or thermal grease or paste or a conductive material disposed on the surface via an additive process such as sputtering).

A conductor 20 is disposed on substrate surface 16b about circuits 18a-18d. A frame 22 is disposed on the substrate surface 16b and is in electrical contact with conductor 20. A lid 24 is disposed over the frame above the RF circuitry. Conductor 20, frame 22 and lid 24 form a conductive shield over circuits 18a-18d and also allow circuits 18a-18d to be hermetically sealed. In some embodiments, it is not necessary for circuits 18a-18d to be hermetically sealed in which case frame and/or conductor 20 may be omitted.

A connector 26 is disposed on one side-edge 16c (FIG. 1A) of substrate 16 and is electrically coupled to the RF circuitry. Connector 26 couples digital (e.g. TTL level logic signals) and power signals (e.g. DC signals) to respective portions of circuits 18a-18d via pins 28 and connector 26 couples RF signals to respective portions of circuits 18a-18d and via connectors 30 having signal pins 32 (most clearly visible in FIG. 1). Thus, since RF, digital and power signals pass through connector 26, connector 26 may be referred to as a multifunction connector.

Side-edge 16d of substrate 16 is provided having a conductive material 34 disposed thereon. As noted above, one or more signal paths are provided in the layers of substrate 16. As can be seen most clearly in FIG. 1, the ends of at least some signal paths (such as RF signal paths) terminate on side-edge 16d of substrate 16. To access such signal paths, pads 36 are formed on the side-edge in the regions of the side edge where the signal paths end and. Respective ones of the pads are electrically coupled to corresponding ones of the ends of the signal paths to facilitate coupling of electrical signals (e.g. RF signals) from the signal paths to circuits (e.g. devices, modules, additional circuitry) external to the RF module.

It should be noted that a non-conductive relief area is provided around each of the pads 36 so as to electrically isolate pads 36 from ground plane 34. It should also be appreciated that ground plan 34 is in electrical contact with conductor 20 (FIG. 1A) as well as with ground plane conductors disposed on substrate surface 16a (not visible in FIGS. 1, 1A).

Thus, if the RF module 10 is fabricated by the lamination of high temperature co-fired ceramic (HTCC), this allows for electrical traces to be placed on various layers within the substrate 16. The process allows for an RF signal line to be embedded (or "buried") within the substrate 16 and the required grounding (necessary for the creation of a transmission lines) to be placed at desirable locations. RF signal traces may be routed to one or more outer edges of the RF module (e.g. side-edge 16d) and pads 36 can be formed on the edge 16d of the substrate 16 by selectively plating the edge 16d of the RF module substrate.

The selective plating allows for non-conductive regions 38 which separate the ground plane 34 from the signal pads 36 thus creating a port for an RF transmission line. With this technique, the plating which creates the RF ground plane 34 is also in electrical contact with the heat sink 12 which now becomes part of the RF ground plane. As will be explained further below in conjunction with FIGS. 2 and 3, the continuation of this RF ground allows for the use of a connector pin having a diameter which is greatly reduced (as compared to typical RF connector system body diameters) to pass though a cold plate (or other heat sinking structure) making connection with an antenna assembly while maintaining RF signal integrity. Examples of small diameters include, but are not limited to about 0.074 inch, about 0.021 inch and about 0.01 inch. It should, however, be appreciated that the spring probe connector body diameter may vary widely and the particular diameter to use will be selected depending upon the needs of a particular application. This technique of providing RF ports on an edge of an RF module, eliminates the need for a separate RF connector and thus significantly reduces the area on the RF module required for RF signal connections while reducing (and ideally minimizing) the distance between the RF component heat sources (e.g. circuitry 18a-18d) and an external heat sinking structure (e.g. a cold plate).

RF module 10 also includes alignment posts 31 which allow so-called "blind-mate" alignment of RF module 10 with other circuit components (not shown) as is generally known.

Figure 1B:
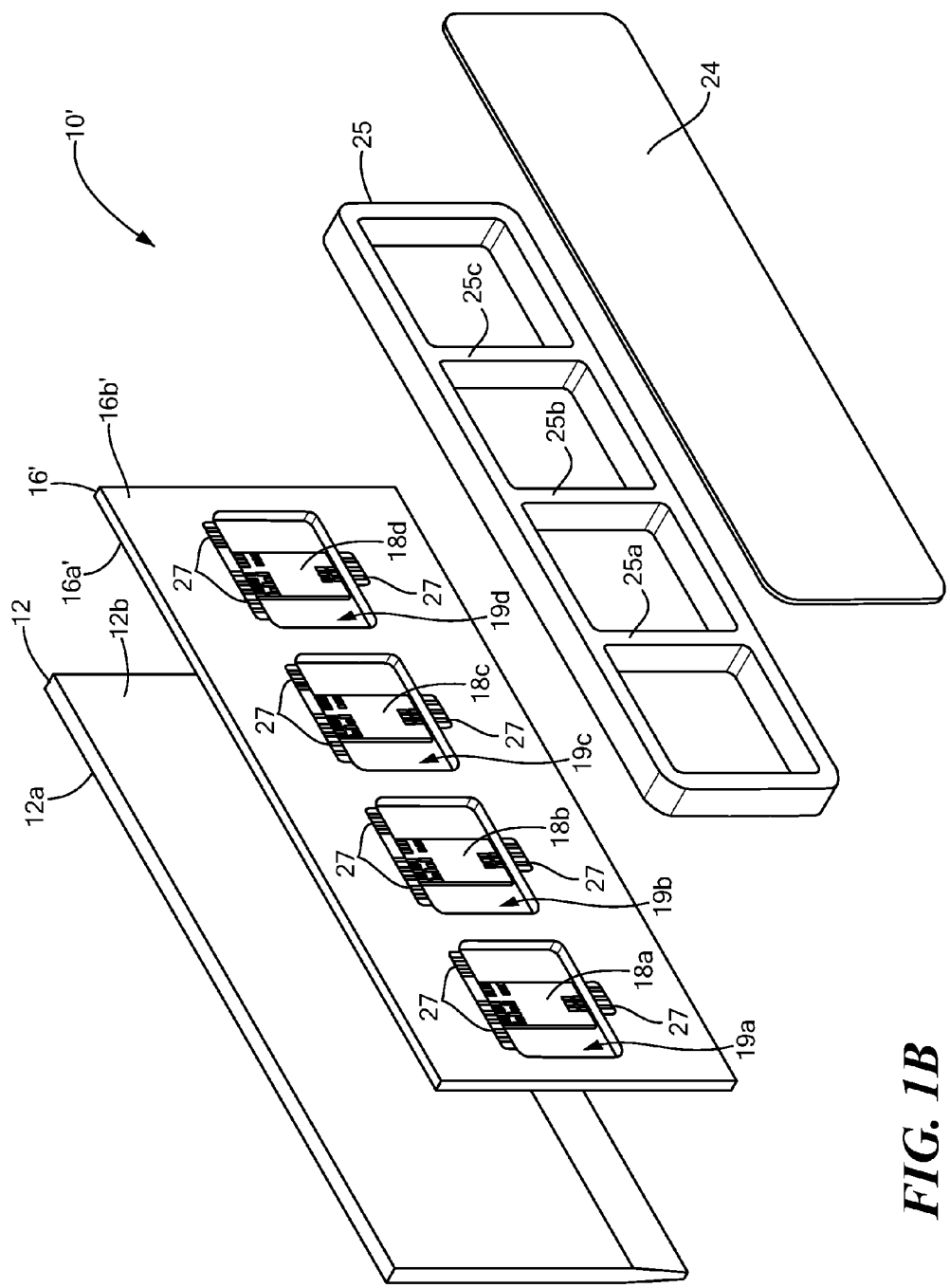
FIG. 1B is an exploded isometric view of an alternate embodiment of a vertical RF module.

Referring now to FIG. 1B in which like elements of FIGS. 1 and 1A, are provided having like reference designations, an alternate embodiment of an illustrative RF module 10' includes a heat sink 12 having first and second opposing surfaces 12a, 12b. A substrate 16' having first and second opposing surfaces 16a', 16b', is disposed over surface 12b of heat sink 12. Surface 12a of heat sink 12 is electrically and thermally conductive so as to function as a ground plane as well as a thermal path for electrical and heat generating circuitry disposed thereon.

Substrate 16' may be provided as a mixed signal multilayer substrate meaning that the substrate includes circuits and signal paths for a variety of different types of signals such as RF, logic and power signals. Substrate 16' and conductive material disposed thereon may be provided, for example, from any of the same materials and techniques described above in conjunction with FIG. 1 for substrate 16 and the associated conductors (e.g. to form signal paths including, but not limited to RF transmission lines, ground planes and other circuitry.

In the illustrative embodiment of FIG. 1B, RF module 10' includes a plurality of circuits, here four circuits 18a, 18b, 18c, 18d for a corresponding number of transmit/receive (T/R) channels, here four T/R channels. Circuits 18a, 18b, 18c, 18d may be the same as or similar to circuits 18a, 18b, 18c, 18d described above in conjunction with FIG. 1. Those of ordinary skill in the art will appreciate, of course, that RF module 10', like RF module 10 in FIG. 1, may include any number of circuits or T/R channels required to satisfy the needs of a particular application. In some applications, circuits 18a-18d may be provided as part of only a receive channel or only a transmit channel.

Circuits 18a, 18b, 18c, 18d are each disposed in a respective ones of openings or recess regions 19a'-19d' provided in substrate 16' such that first and second opposing surfaces of the circuits 18a, 18b, 18c, 18d do not extend past planes defined by surfaces 16a', 16b' of substrate 16'.

When substrate 16' and circuits 18a-18d are disposed over a surface of heat sink 12, heat sink 12 acts as both an electrical and thermal conductor for the circuitry disposed thereon. In some embodiments, the surface of the substrate 16' disposed against a surface of the heat sink 12 (here substrate surface 16a) may be provided having an electrically and thermally conductive material disposed thereover (e.g. an electrical or thermal grease or paste or a conductive material disposed on the surface via an additive process such as sputtering).

A conductive frame 25 is disposed on substrate surface 16b' about circuits 18a-18d and is in electrical contact with substrate 16' (e.g. through at least some of conductors 27) and is also in electrical contact with lid 24 which is disposed over the frame above the RF circuitry. Conductive frame 25 includes arms 25a-25c such that frame 25 forms individual enclosures around respective ones of circuits 18a-18d. Thus, frame 25 and lid 24 form a conductive shield over and around circuits 18a-18d. In some embodiments, circuits 18a-18d may be hermetically sealed.

For clarity, connectors have been omitted from FIG. 1B. However, it should be appreciated that FR module 10' may include connectors (including multifunction connectors) which may be the same as or similar to signal pins 28, 32 and connector bodies 26, 30 as described above in conjunction with FIG. 1

Similar to RF module 10 describe above in conjunction with FIG. 1, if the RF module 10' is fabricated by the lamination of high temperature co-fired ceramic (HTCC), this allows for electrical traces to be placed on various layers within the substrate 16'. The process allows for an RF signal line to be embedded (or "buried") within the substrate 16' and the required grounding (necessary for the creation of a transmission lines) to be placed at desirable locations. RF signal traces may be routed to one or more outer edges of the RF module and pads can be formed on the edge of the substrate 16' by selectively plating the edge of the RF module substrate.

Figure 2:
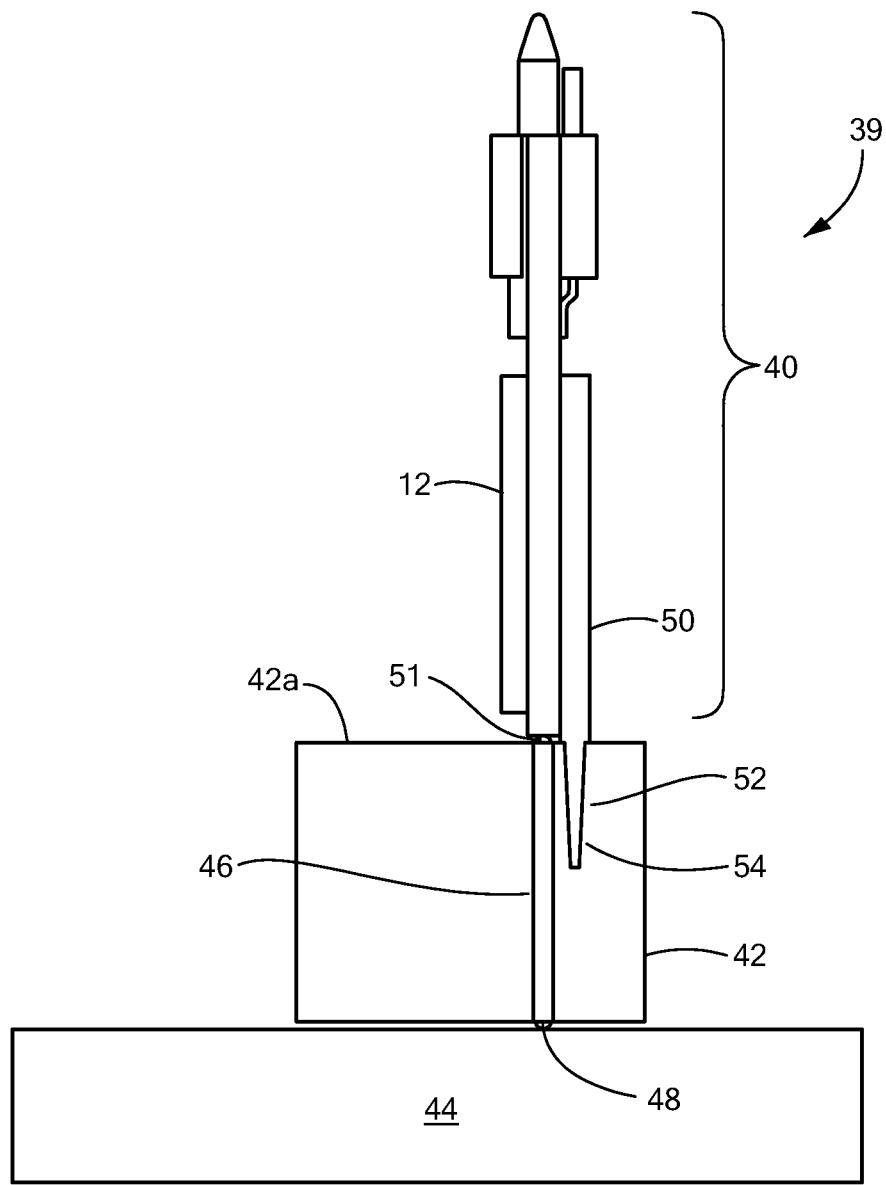
FIG. 2 is a side view of an RF system including a vertical RF module thermally coupled to a cold plate and electrically coupled to an antenna assembly.

Referring now to FIG. 2 an RF module 40 which may be the same as or similar to RF module 10 described above in conjunction with FIGS. 1 and 1A. RF module 40 is disposed on a cold plate 42. Cold plate 42 is, in turn, disposed on an antenna assembly 44 and serves to cool the antenna assembly. In one embodiment, antenna assembly 44 corresponds to an AESA antenna. It should be appreciated, of course, that cold, plate 42 may be provided as any type of heat sinking or cooling structure capable of cooling antenna assembly 44. RF module 40 is at least thermally coupled to cold plate 42 and is at least electrically coupled to antenna assembly 44 as will be described below. Mechanical elements (e.g. fasteners, frames, housings and other mechanical structures) may be used to mechanically securely attach RF module 40, cold plate 42 and antenna assembly 44 to each other.

An electrical connector 46 (which may be provided, for example, as a spring loaded electrical connector) is disposed through the cold plate 42 with a first end of the electrical connector 46 coupled to an RF signal port of the antenna assembly 44 and a second end of the electrical connector 46 coupled to an RF signal port 50 provided on a side-edge of the RF module 40. RF signal port 50 may be provided on RF module 40 in the same manner as RF signal ports 36 described above in conjunction with FIGS. 1 and 1A. Thus, RF signals propagate between RF module 40 and antenna assembly 44 through electrical connector 46.

RF module 40 includes an RF module heat sink 50 having an extended section 52 which in this illustrative embodiment is provided as a tapered section 52 (i.e. a side view or cross-sectional view of the extended section 52 is tapered or can be said to have a triangular cross-section shape). In addition to serving as an electrical conductor to circuits included in RF module 40, heat sink 50 also functions as a thermal conductor which allows for the transfer of heat energy from the RF module 40 to the cold plate 42.

Efficient heat transfer is accomplished by embedding the tapered portion 52 of heat sink 50 into opening 54 provided in cold plate 42. Opening 54 is preferably provided having a shape which is substantially complementary to the shape of extended region 52, although this is not strictly necessary. In practice, to improve the electrical and thermal connection between extended heat sink section 52 and cold plate 42, a thermally and electrically conductive material (e.g. a paste or grease) may be disposed between the surfaces of tapered region 52 and the mating surfaces of opening 54. This may be accomplished, for example, by applying a thermally and electrically conductive material to the surface of one or both of tapered region 52 or opening 54.

The size and shape of extended region 52 and opening 54 are selected to suit the needs of a particular application with which the RF module is being used and may be selected in accordance with a variety of factors including, but not limited to: the frequency of operation of the RF module, the amount of heat generated by RF module, RF module size (e.g. length, width, height, thickness of the RF module heat sink), size of the heat sinking structure (e.g. cold plate) in which the extended portion of the RF module heat sink is embedded (e.g. length, width, height, thickness of the heat sinking structure), and the material from which both the RF module heat sink and the heat sinking structure are made.

Embedding a tapered portion 54 of heat sink 52 into the cold plate 42 serves several functions: (1) the surface area of contact between heat sink 52 and cold plate 42 is increased which results in a concomitant increase in heat transfer between the heat sink 52 and cold plate 42; (2) embedding the heat sink into the cold plate provides a continuation of the RF ground from the RF module to the cold plate and this allows for the use of a relatively small diameter connector pin to pass though the cold plate to provide an electrical connection between the RF module and he an antenna assembly while maintaining RF signal integrity; (3) improves the mechanical connection between the RF module and the cold plate; and (4) improves the mechanical alignment between the RF module and the cold plate if the mechanical tolerances of the dimensions of extended portion of the heat sink and the corresponding opening in the cold plate can be controlled to a small range.

The resulting RF module—cold plate—antenna assembly significantly reduces the area required for RF signal connections while reducing (and ideally minimizing) the distance between the heat generating circuitry in the RF module (i.e. RF component heat sources) and the cold plate which serves to improve cooling of such heat generating RF components.

Although the extended section 52 of heat sink 50 is shown as a tapered section, it should of course, be appreciated that that extended section 52 may be provided having any shape, tapered or non-tapered. For example, in some applications it may be desirable to provide the extended section 52 having a rectangular shape. As noted above, opening 54 is preferably provided having a shape which is substantially complementary to the shape of extended section 52, although this is not strictly necessary. It should be appreciated that while other shapes may be used, the taper described herein provides a locating feature and helps to improve the heat transfer. The heat transfer is improved by the elimination of gaps between the mating surfaces which may occur due to variation in part sizes based on manufacturing tolerance limitations. The taper thus helps to reduce (and ideally minimize) the effects of these tolerances on the heat transfer and part location.

It should be appreciated that lid 51 (which may be the same as or similar to lid 24 described above in conjunction with FIGS. 1 and 1A) is shown spaced apart from surface 42a of cold plate 42. Ideally, an edge of lid 51 should contact surface 42a to further increase transfer of thermal energy from RF module 40 to cold plate 42 and also to improve ground plan continuity between RF module 40 to cold plate 42. However, due to limitations in tolerances associated with fabricating mechanical parts, this is not always possible.

Figure 3:
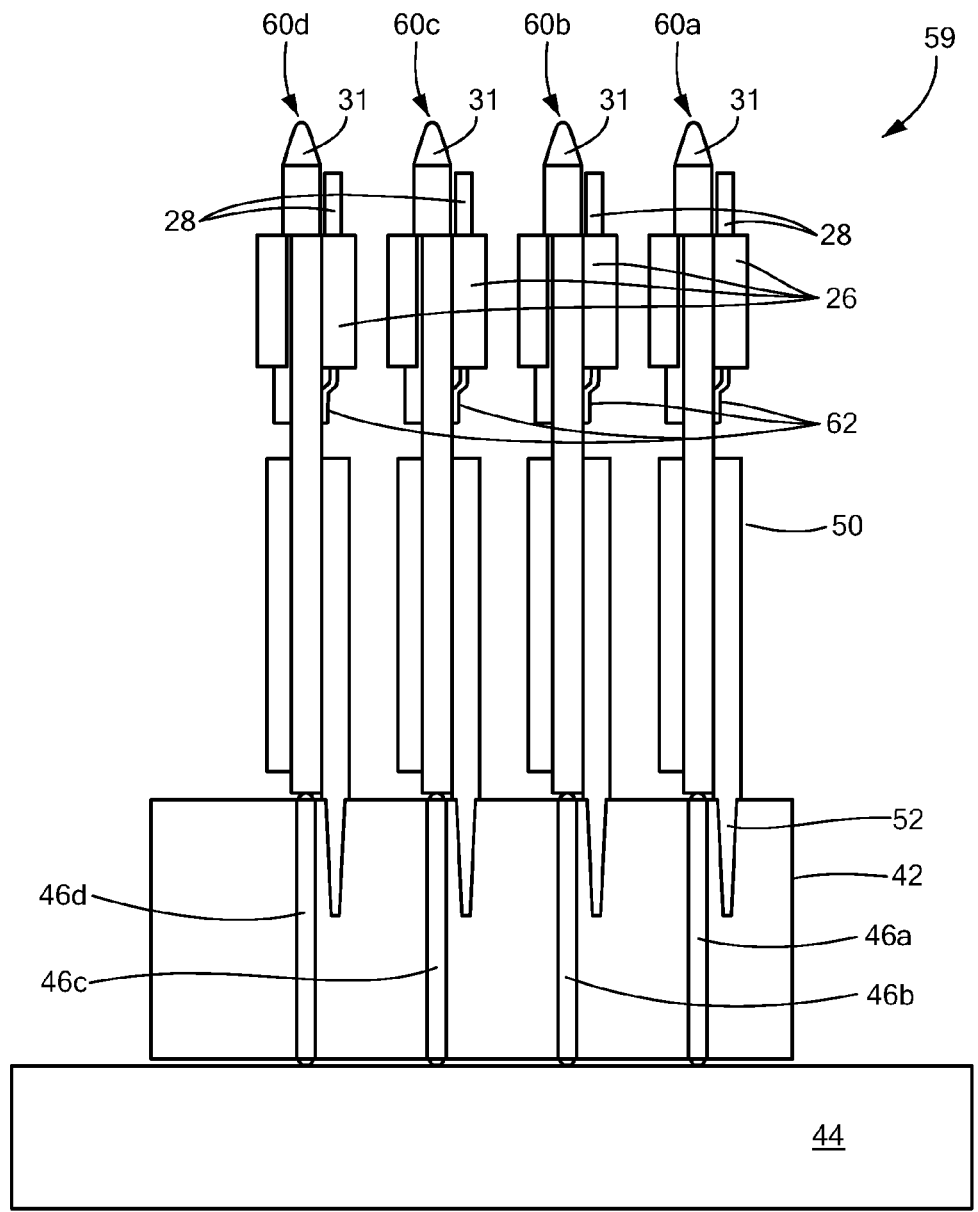
FIG. 3 is a side view of an RF system including a plurality of vertical RF modules disposed to provide a subassembly used in an active electronic scanned array (AESA) antenna.

Referring now to FIG. 3 in which like elements of FIGS. 1, 1A and 2 are provided having like reference designations, an RF system 59 (which may be a portion of a radar system comprising an AESA antenna, for example) includes a sub assembly of four RF modules 60a-60d, which may be the same as or similar to RF modules 10 and 40 described above in conjunction with FIGS. 1, 1A and 2, are each thermally coupled to a cold plate 42 via embedded extended heat sink regions 52 and electrically coupled to an antenna assembly via connectors 46a-46d which extend between respective ones of RF modules 60a-60d and corresponding RF ports on antenna assembly 44.

Each of the heat sinks 50 allow for the transfer of heat from the RF modules 60a-60d to the cold plate 42 primarily through the embedded, extended heat sink sections 52 as discussed above.

As noted above, the manner in which RF signal ports are formed on the substrates of the RF modules significantly reduces the area required for RF signal connections while minimizing the distance between the RF component heat sources and the cold plate.

The systems, circuits and techniques described herein have application in a wide variety of different applications. For example, the antenna assembly may include active or passive antenna elements for missile sensors that require bandwidth, higher gain to support link margin, and wide impedance bandwidth to support higher data-rates, within a small volume. They may also be used as antennas for land-based, sea-based, or satellite communications. Because RF systems having small volume are possible due to the embedded extended heat sink configuration described herein, the systems are well suited for use on small missile airframes. RF systems utilizing the concepts, systems and circuits described herein may also be used in, for example, handheld communication devices (e.g., cell phones, smart phones, etc.), commercial aircraft communication systems, automobile-based communications systems (e.g., personal communications, traffic updates, emergency response communication, collision avoidance systems, etc.), Satellite Digital Audio Radio Service (SDARS) communications, proximity readers and other RFID structures, radar systems, global positioning system (GPS) communications, and/or others. In at least one embodiment, the concepts, systems and circuits described herein may be adapted for use in medical imaging systems. The RF systems described herein may be used for both transmit and receive operations. Many other applications are also possible.

It should of course be understood that while the present technology has been described with respect to disclosed embodiments, numerous variations, alternate embodiments, equivalents, etc. are possible without departing from the spirit and scope of the claims. For example, any of a number of elements may be used in the phased array.

In addition, it is intended that the scope of the present claims include all other foreseeable equivalents to the elements and structures as described herein and with reference to the drawing figures. Accordingly, the subject matter sought to be protected herein is to be limited only by the scope of the claims and their equivalents.

Having described preferred embodiments which serve to illustrate various concepts, structures and techniques, which are the subject of this patent, it will now become apparent to those of ordinary skill in the art that other embodiments incorporating these concepts, structures and techniques may be used. For example, it should be noted that individual concepts, features (or elements) and techniques of different embodiments described herein may be combined to form other embodiments not specifically set forth above. Furthermore, various concepts, features (or elements) and techniques, which are described in the context of a single embodiment, may also be provided separately or in any suitable sub-combination. It is thus expected that other embodiments not specifically described herein are also within the scope of the following claims.

Accordingly, it is submitted that that scope of the patent should not be limited to the described embodiments, but rather should be limited only by the spirit and scope of the following claims.

All publications and references cited herein are expressly incorporated herein by reference in their entirety.

What is claimed is:

1. A radio frequency (RF) module comprising: a multilayer substrate having a first surface, a second opposing surface having one or more recesses provided therein, one or more RF signal paths provided on at least one layer of said multilayer substrate, a first edge having a conductor disposed thereon to form one or more RF pads with each of the one or more RF pads coupled to a corresponding one of the one or more RF signal paths provided in said multilayer substrate, and a ground plane disposed on the first edge about each of the one or more RF pads; circuitry, including at least two of: RF circuitry, digital circuitry, or power circuitry disposed in at least one of the one or more recesses of said substrate; a thermally and electrically conductive heat sink disposed on the first surface of said substrate having first and second opposing surfaces and at least section which extends past an edge of the said substrate; a conductive lid disposed over said RF circuitry; and a multifunction connector comprising at least two of: RF, DC or digital connections, said multifunction connector disposed on a second edge of said substrate and electrically coupled to respective ones of said RF, digital or power circuitry.

2. The RF module assembly of claim 1, wherein: said circuitry comprises RF, digital and power circuitry; and said multifunction connector comprises RF, DC and digital connections coupled to respective ones of said RF, digital and power circuitry.

3. The RF module assembly of claim 1, further comprising a frame disposed on the second surface of said substrate about said circuitry.

4. The RF module assembly of claim 1, wherein said heat sink is provided from metal.

5. The RF module assembly of claim 1, wherein said heat sink is provided from a core material having a relatively low electrical and thermal conductivity characteristic and a thermally and electrically conductive material is disposed over a surface of the core material.

6. A radio frequency (RF) system comprising: an antenna assembly having first and second opposing surfaces; a heat sinking structure having first and second opposing surfaces with the first surface of said heat sinking structure disposed over the second surface of said antenna assembly; and an RF module assembly disposed over the second surface of said cold plate, said RF module assembly having a heat sink with an extended section embedded into the second surface of said heat sinking structure, said RF module assembly comprising: a multilayer substrate having a first surface, a second opposing surface having one or more recesses provided therein, one or more RF signal paths provided on at least one layer of said multilayer substrate, a first edge having a conductor disposed thereon to form one or more RF pads with each of the one or more RF pads coupled to a corresponding one of the one or more RF signal paths provided in said multilayer substrate, and a ground plane disposed on the first edge about each of the one or more RF pads; Circuitry, including at least two of: RF circuitry, digital circuitry, and power circuitry disposed in at least one of the one or more recesses of said substrate; a thermally and electrically conductive heat sink disposed on the first surface of said substrate having first and second opposing surfaces and at least section which extends past an edge of the said substrate; A conductive lid disposed over said RF circuitry; and a multifunction connector comprising at least two of: RF, DC and digital connections, said multifunction connector disposed on a second edge of said substrate and electrically coupled to at least two of said RF, digital and power circuitry; and an RF signal path disposed through said heat sinking structure with a first end of said RF signal path electrically coupled to said RF module and a second end of said RF signal path electrically coupled to said antenna assembly.

7. The RF system of claim 6 wherein said heat sinking structure is provided having a plurality of openings provided therein and said RF system comprises a like plurality of RF modules with each of said plurality of RF modules comprising a heat sink with an extended section disposed in a respective one of the plurality of openings provided in the cold plate.

8. The RF system of claim 7 further comprising a plurality of RF signal paths, each of said plurality of RF signal paths disposed through said heat sinking structure with a first end of each RF signal path electrically coupled to said RF module and a second end of each RF signal path electrically coupled to said antenna assembly.

9. The RF system of claim 6 wherein said RF signal path is provided as a connector pin.

10. The RF system of claim 6 wherein:
said heat sinking structure is provided a cold plate; and
said RF signal path is provided as a spring-loaded electrical RF connector disposed through said cold plate.

11. The RF system of claim 6 wherein: said heat sinking structure comprises: a metallic heat sink having first and second opposing surfaces and at least one tapered edge; said substrate is provided having first and second opposing surfaces and a plurality of edges with at least one edge having an RF signal path exposed thereon, with a first one of the first and second opposing surfaces disposed over a first one of the first and second opposing surfaces said metallic heat sink; RF circuitry disposed on at least a second one of the first and second opposing surfaces of said substrate; and said RF signal path is provided as a spring-loaded electrical RF connector disposed through said metallic heat sink wherein the first end of said spring-loaded electrical RF connector is in electrical contact with an RF signal path exposed on an edge of said substrate.

12. The RF system of claim 11 wherein said spring-loaded electrical RF connector comprises a connector pin having a small diameter.

13. The RF system of claim 6 wherein said heat sinking structure is provided as a cold plate, said cold plate having a plurality of openings provided therein and said RF system comprises a like plurality of RF modules with each of said plurality of RF modules comprising a heat sink with an extended section disposed in a respective one of the plurality of openings provided in the cold plate.

14. The RF system of claim 13 further comprising a plurality of RF signal paths, each of said plurality of RF signal paths disposed through said cold plate with a first end of each RF signal path electrically coupled to said RF module and a second end of each RF signal path electrically coupled to said antenna assembly.

15. The RF system of claim 14 wherein each of said plurality of RF signal paths is provided as a spring-loaded electrical RF connector.

* * * * *